US 11,223,891 B2

(12) United States Patent
Liang et al.

(10) Patent No.: US 11,223,891 B2
(45) Date of Patent: Jan. 11, 2022

(54) SYSTEM AND METHOD THEREOF

(71) Applicant: xMEMS Labs, Inc., Santa Clara, CA (US)

(72) Inventors: Jemm Yue Liang, Sunnyvale, CA (US); Hsi-Sheng Chen, Fremont, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 17/149,666

(22) Filed: Jan. 14, 2021

(65) Prior Publication Data

US 2021/0258676 A1    Aug. 19, 2021

Related U.S. Application Data

(60) Provisional application No. 63/079,680, filed on Sep. 17, 2020, provisional application No. 63/057,515, filed on Jul. 28, 2020, provisional application No. 62/978,717, filed on Feb. 19, 2020.

(51) Int. Cl.
*H04R 1/10* (2006.01)

(52) U.S. Cl.
CPC ................................. *H04R 1/1016* (2013.01)

(58) Field of Classification Search
CPC ...... H04R 1/1016; H04R 1/1083; H04R 1/22; H04R 27/00; H04R 2225/025; H04R 25/30; H04R 25/04; H04R 25/305; H04R 25/407
USPC ....................................................... 381/337
See application file for complete search history.

(56) References Cited

U.S. PATENT DOCUMENTS

| | | | |
|---|---|---|---|
| 9,392,366 B1* | 7/2016 | Meyer | H04R 25/505 |
| 2003/0138111 A1* | 7/2003 | Cheng | H04R 1/00 381/71.7 |
| 2009/0245529 A1* | 10/2009 | Asada | G10K 11/17875 381/71.6 |
| 2015/0195646 A1* | 7/2015 | Kumar | G10K 11/17821 381/71.8 |
| 2016/0267899 A1* | 9/2016 | Gauger, Jr. | H04R 1/10 |
| 2019/0237058 A1* | 8/2019 | Vogel | G10K 11/17853 |

FOREIGN PATENT DOCUMENTS

| | | |
|---|---|---|
| EP | 1 923 864 A2 | 5/2008 |
| EP | 1 923 864 A3 | 6/2016 |
| EP | 3 684 071 A1 | 7/2020 |
| WO | 2019/053995 A1 | 3/2019 |

* cited by examiner

*Primary Examiner* — Alexander Krzystan
*Assistant Examiner* — Julie X Dang
(74) *Attorney, Agent, or Firm* — Winston Hsu (57) ABSTRACT

A system, disposed within a wearable hearing device, includes a sound producing device (SPD) driven by a driving voltage, a first sound sensing device, and a subtraction circuit. The first sound sensing device is configured to sense a combined sound pressure produced at least by the SPD and generate a sensed signal accordingly. The subtraction circuit has a first input terminal, a second input terminal, and a first output terminal. The first input terminal is coupled to the first sound sensing device, and the first output terminal is coupled to the SPD. A first phase delay between the driving voltage and the sensed signal is less than 60°.

28 Claims, 9 Drawing Sheets

SYSTEM AND METHOD THEREOF

CROSS REFERENCE TO RELATED APPLICATIONS

This application claims the benefit of U.S. provisional application No. 62/978,717 filed on Feb. 19, 2020, U.S. provisional application No. 63/057,515 filed on Jul. 28, 2020, and U.S. provisional application No. 63/079,680 filed on Sep. 17, 2020, which are all incorporated herein by reference.

BACKGROUND OF THE INVENTION

1. Field of the Invention

The present invention relates to a system and a method, and more particularly, to a system and a method, which optimize the quality of active noise cancellation.

2. Description of the Prior Art

Conventional Active Noise Canceling (ANC) only reduces acoustic/sound pressure(s) from the ambient environment. However, for a true-wireless (TWS) earpiece which is generally of in-ear-monitor (IEM) type, a sound producing driver is inserted into the ear-canal of a listener, forming a completely-sealed or semi-sealed chamber. For the in-ear insertion type earpiece, an effect called occlusion and its associated microphonic effect become a major source of noises, and such noises do not originate from acoustic sources, but from mechanical ones.

Considering TWS earpieces are often worn while the user jogs, exercises, eats, or talks and most of the weights of the earpieces, especially the batteries, dangled outside of the user's ears, are held in place by cushy soft foam/silicon tips and light contacts with the user's conchae, it can be easily visualized noises of sound pressure level (SPL) higher than 110 decibel (dB) may arise from minute movements of such TWS earpieces.

Yet another source of mechanical motion is the use of "control gestures". Unlike wired earpieces where the presence of a nearby controlling host device can be assumed, wireless TWS earpieces are semi-standalone wearable and it is common to have their host device tugged away somewhere less accessible, making it highly desirable to interact with these TWS earpieces by finger gestures such as tapping, sliding, or squeezing, all of which can produce very high SPL noise spikes due to the microphonic effect.

It is obviously desirable to suppress noises originated from the occlusion effect and microphonic effect.

Due to their mechanical origin(s), one common characteristic shared among these noises is they tend to be very impulsive in amplitude. Such impulsiveness means these noises are non-stationary, implying information gathered in one cycle of a sine wave cannot be reliably used to predict the behavior of the next cycle.

A main difficulty conventional TWS earpiece ANC system designers face is rooted in the hardware they use in the signal chain. For example, on the sound sensing end, a typical condenser microphone uses a C-R circuit to convert the change of capacitance to a voltage signal. Such C-R circuit would produce a 90° phase-lag in the sound pressure to voltage conversion. On the sound producing end, the mass (inertia) and resonance frequency of a coil-magnet based dynamic driver often induces mechanical time shift of +/−100 s microseconds around the resonance frequency. These latencies (of the microphone and speaker) force system designers of conventional ANC to employ circuits with a total of 180°, 360° or even higher phase lag. In other words, the ANC system designers are forced to use information from half previous cycle, one previous cycle or even earlier, to predict the anti-noise signal level for the present time instant. The conventional ANC model involves generating anti-noise sound pressure using transfer functions having a phase lag around 180°, 360°, 270° or higher relative to the noise sound pressure, while assuming the noise amplitude would remain stationary after such phase/time lags. The conventional ANC scheme is essentially confined to canceling only stationary noise(s).

For microphonic noises caused by walking or jogging, tapping or other gesture, jaw movements and for intermittent ambient noises induced when, for example, trains/motorcycles are passing, when doors/drawers are closing, or when cars are moving over potholes or gravels, the amplitude profile would be pulse-shaped with irregular and intermittent sharp spikes. Noises with such rapidly changing amplitudes violate the "stationary noise" assumption of conventional ANC model and loud noises would remain to be heard even when the ANC feature is enabled.

SUMMARY OF THE INVENTION

It is therefore a primary objective of the present invention to provide a system and a method, which exhibits near-zero phase delay and achieve real-time noise cancelling for both non-stationary and stationary noises.

An embodiment of the present invention provides a system. The system, disposed within a wearable hearing device, includes a sound producing device (SPD) driven by a driving voltage, a first sound sensing device configured to sense a combined sound pressure produced at least by the SPD and generate a sensed signal accordingly, and a subtraction circuit having a first input terminal, a second input terminal, and a first output terminal, wherein the first input terminal is coupled to the first sound sensing device, the first output terminal is coupled to the SPD, wherein a first phase delay between the driving voltage and the sensed signal is less than 60°.

Another embodiment of the present invention provides a method. The method includes sensing, by a first sound sensing device, a combined sound pressure produced at least by a sound producing device and producing, by the first sound sensing device, a sensed signal according to the combined sound pressure; deducting a signal corresponding to the combined sound pressure from an input audio signal to obtain a difference signal, wherein the first signal is generated according to the sensed signal; obtaining a driving voltage according to the difference signal; and producing, by the sound producing device, a produced sound according to the driving voltage; wherein a first phase delay between the driving voltage and the sensed signal is less than 60°.

Another embodiment of the present invention provides a system. The system includes a sound producing device (SPD), driven by a driving voltage; a sound sensing device, configured to sense a combined sound pressure produced at least by the SPD and generate a sensed signal accordingly; and a subtraction circuit, having a first input terminal, a second input terminal, and a first output terminal, wherein the first input terminal is coupled to the sound sensing device, the first output terminal is coupled to the SPD; wherein the SPD, the sound sensing device, and the subtraction circuit constitute a feedback loop; wherein a phase delay from the driving voltage being applied to the SPD to a produced sound being produced by the SPD corresponding to the driving voltage is less than 30°.

Another embodiment of the present invention provides a system. The system includes a sound producing device (SPD), driven by a driving voltage; a sound sensing device, configured to sense a combined sound pressure produced at least by the SPD and generate a sensed signal accordingly; and a subtraction circuit, having a first input terminal, a second input terminal, and a first output terminal, wherein the first input terminal is coupled to the sound sensing device, the first output terminal is coupled to the SPD; wherein the SPD, the sound sensing device, and the subtraction circuit constitute a feedback loop; wherein a phase delay from the combined sound pressure impinging upon the sound sensing device to the signal being generated by the sound sensing device corresponding to the combined sound pressure is less than 30°.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
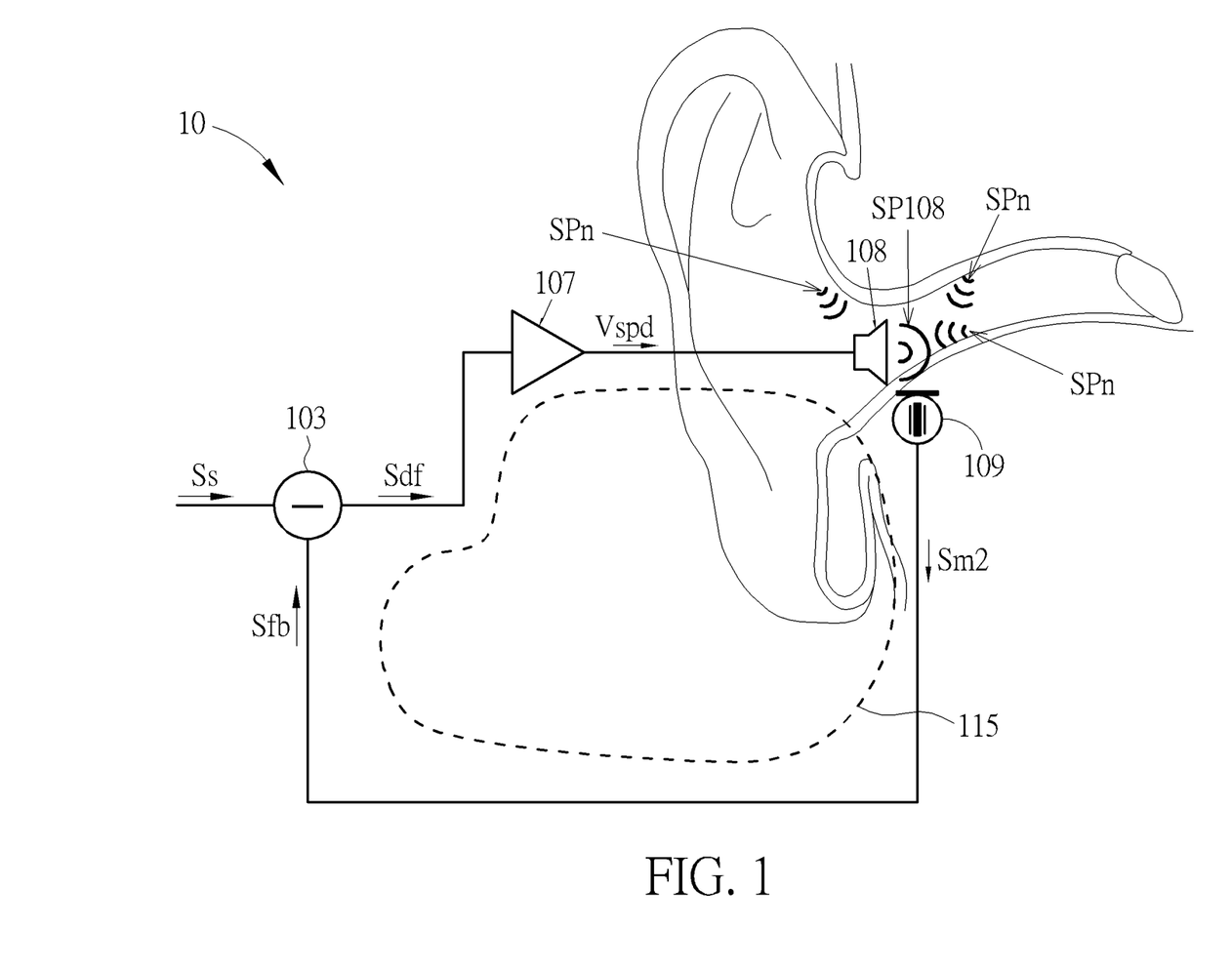
FIG. 1 to FIG. 6 are respectively schematic diagrams of a system according to an embodiment of the present application.

FIG. 1 is a schematic diagram of a system 10 according to an embodiment of the present application. The system 10 is disposed within a wearable hearing device. The wearable hearing device may be, e.g., a headphone, a headset, an earbuds, an earphone, an earpiece, etc. In an embodiment, the wearable hearing device may be an insertion type of earpiece. The system 10 may include a sound producing device (SPD) 108, a sound sensing device 109, a subtraction circuit 103, and an amplifying circuit 107 to constitute a feedback loop 115.

The sound sensing device 109 senses/detects not only a sound SP108 produced by the SPD 108 but also undesired noises (or noise sound pressure) SPn from ambient/background acoustic source(s) or from mechanical source(s). The undesired noises (SPn) may be, for example, due to the movement of the system 10 (serving as an earpiece) during hard exercise or when a listener taps the system 10, due to the ear canal volume change of the listener (when the listener's jaw moves), or due to the blood vessel pulsation of the listener. In other words, the SPD 108 is just one out of many sound sources. Furthermore, the combined sound/acoustic pressure sensed by the sound sensing device 109 is the "net sound/acoustic pressure" present within the listener's ear canal, no matter what the source(s) is/are or what the nature of the source(s) is. The combined sound pressure (which is, for instance, the superposition of the noises SPn on the sound SP108) from all these different sources would be sensed by the sound sensing device 109 and converted to an (electrical) signal (e.g., a signal Sfb), which is transmitted to/toward the subtraction circuit 103. In an embodiment, the combined sound pressure may comprise component caused by air leakage due to the SPD 108 or the wearable hearing device, in which the system 10 is disposed, through, e.g., a vent thereof. A difference signal Sdf may be delivered to the amplifying circuit 107. The amplifying circuit 107 produces a driving voltage Vspd for the SPD 108. The output (namely, the sound SP108) of the system 10 is routed back as one of the inputs of the system 10, such that the sound sensing device 109 creates the feedback loop 115. A variation/extension of the feedback loop 115 would be similar to a feedback loop of a negative-feedback operational amplifier (OP-amp) circuit, which will be detailed later.

The subtraction circuit 103 coupled to the sound sensing device 109 is configured to deduct the signal Sfb from an input audio signal Ss to obtain the difference signal Sdf (namely, Sdf=Ss−Sfb). In an embodiment, the difference signal Sdf may comprise component associated with an aggregation of the noises SPn with inverse polarity, or with negative version of the aggregation of the noises SPn.

Specifically, the amplifying circuit 107 may have a cutoff frequency, and the amplifying circuit 107 may amplify low frequency component of the signal Sdf, below the cutoff frequency, with the high amplifying gain. Meanwhile, the amplifying circuit 107 may perform an integration operation for high frequency component of the signal Sdf, above the cutoff frequency. Through the integration operation, the noises SPn may be suppressed within the loop 115. In an embodiment, the amplifying circuit 107 may be realized by, e.g., an operational amplifier.

In an embodiment, the amplifying circuit 107 may be replaced by an integration circuit. In this case, the integration circuit 107 and the subtraction circuit 103 may regarded as a delta-sigma circuit, where the delta part is realized be the subtraction circuit 103 and the sigma part is realized by the integration circuit 107.

Different from the prior art, the SPD 108 and the sound sensing device 109 have near-zero-phase-lag (NZPL) features, introduced in U.S. provisional application No. 62/909, 684 and/or U.S. Pat. No. 10,867,594, such that a first phase lag/delay from the driving voltage Vspd to a sensed signal Sm2 (sensed by sound sensing device 109) is much less than 90°. Preferably, the phase lag/delay from the driving voltage Vspd to the sensed signal Sm2 may be less than 25° within the effective ANC bandwidth of the system 10. In this case, by driving the SPD 108 using the feedback loop 115, it becomes feasible to compensate/counteract/neutralize the impact of all sorts of extraneous/undesired sound sources (namely, the noises SPn) and to produce, as a result, the "net sound pressure" within the ear canal, which becomes largely devoid of deviation from the desired sound pressure as if all the noises SPn are absent. In this manner, active noise cancelling (ANC) is achieved through the use of the system 10. So long as the sound sensing device 109 operates well within its linear frequency response range, the feedback loop 115 may minimize the difference between the input audio signal Ss and the signal Sfb, thereby minimizing the difference between the input audio signal Ss and a signal corresponding to the combined/net sound pressure heard by the listener.

Specifically, the NZPL feature of the sound sensing device 109 may represent that a second phase lag/delay from an acoustic sound (or the combined sound pressure) impinging upon the sound sensing device 109 to the signal Sm2 being generated by the sound sensing device 109 according to the impinging acoustic sound is less than, preferably, 10°;

the NZPL feature of SPD 108 may represent that a third phase lag/delay from the driving voltage Vspd being applied to the SPD 108 to the SPD 108 producing a sound SP108 corresponding to the driving voltage Vspd is less than, preferably, 10°.

The NZPL conditions may be generalized as: 1) the first phase delay (from Vspd to Sm2) is less than 60°; 2) the second phase delay (from impinging acoustic sound to Sm2) is less than 30°; and 3) the third phase delay (from Vspd to SP108) is less than 30°. As long as one of the above NZPL conditions is satisfied, along with the feedback loop 115, requirements of the present application are satisfied, which shall be within the scope of the present application.

Note that, the first phase delay (from Vspd to Sm2) comprises an acoustic propagation delay from the SPD 108 to the sound sensing device 109, the second phase delay, and the third phase delay. Therefore, to reduce the first phase delay or to reduce the acoustic propagation delay from the SPD 108 to the sound sensing device 109, a physical spacing between the SPD 108 and the sound sensing device 109 may be less than 3.5 millimeters. In another perspective, the acoustic propagation delay from the SPD 108 to the sound sensing device 109 may be less than 10 microseconds (µs), so as to enlarge the effective ANC bandwidth. Note that, the effective ANC bandwidth of the system (e.g., 10) is related to the physical spacing between the SPD 108 and the sound sensing device 109. The longer the first phase delay, the narrower the effective ANC bandwidth of the system.

Figure 2:
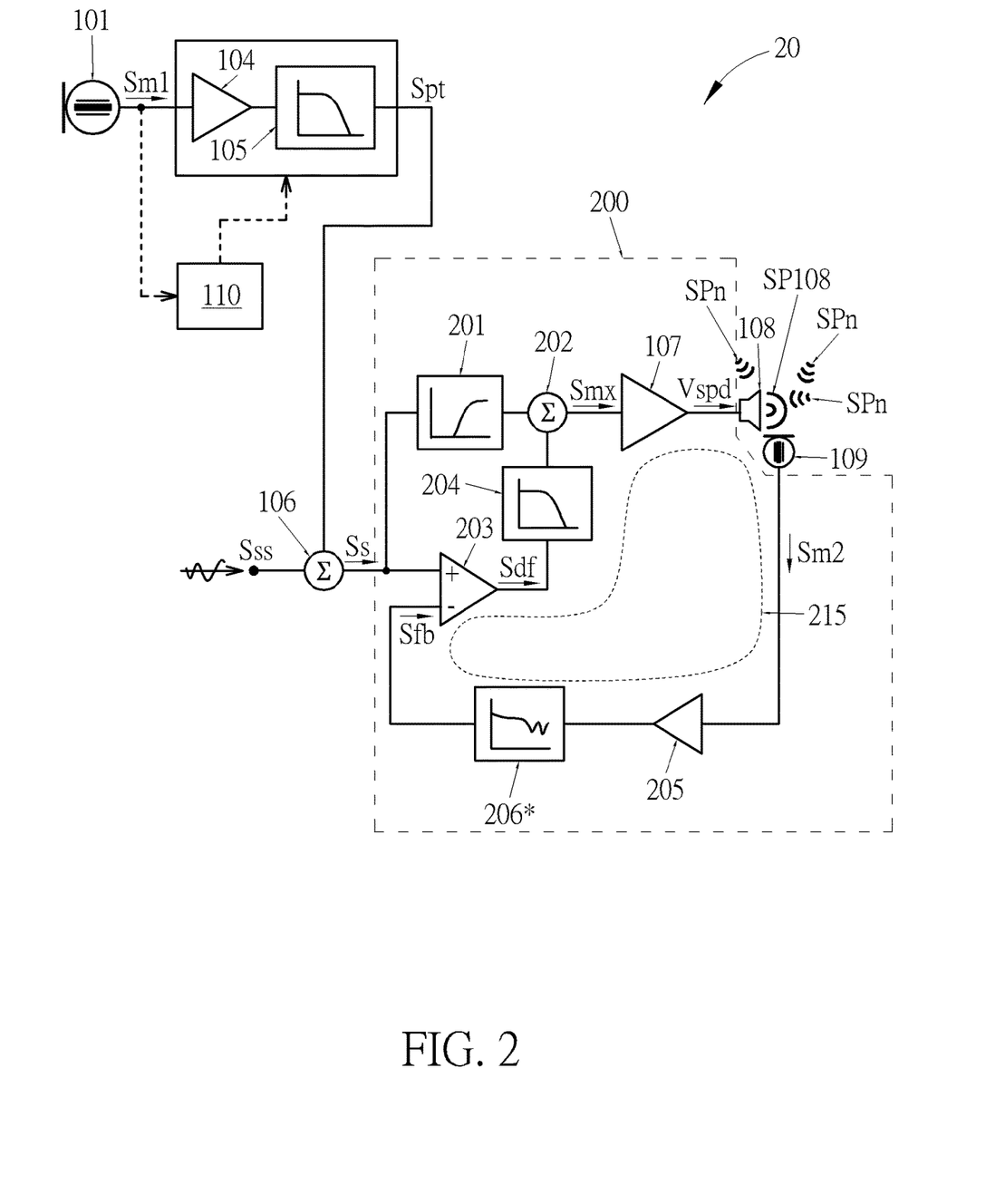

FIG. 2 is a schematic diagram of a system 20 according to an embodiment of the present application. The structure of the system 20 is similar to that of the system 10, and hence the same numerals/notations denote the same components in the following description. The system 20 may include the SPD 108, the sound sensing device 109, and a circuit 200. In general, the circuit 200 may be realized by digital circuit or analog circuit. For example, the subtracting circuit 203 within the circuit 200, corresponding to 103 of circuit 10, may be realized by a differential amplifier, e.g., an operation amplifier (OP Amp).

After the combined sound pressure sensed by the sound sensing device 109 is converted to the sensed signal Sm2, the sensed signal Sm2 may be processed by an amplifier 205 of the circuit 200 and go through a feedback loop 215 of the circuit 200.

The circuit 200 may further include a filter 206* disposed within the feedback loop 215 to produce the signal Sfb. In an embodiment, the frequency response of the filter 206* may be equal to or related (e.g., proportional) to the conjugate or a reciprocal/inverse of the combined frequency response of the SPD 108 and the sound sensing device 109 (which may be measured in an ear emulator such as an IEC 711 occluded ear emulator). In an embodiment, the frequency response of the filter 206* may be a function of the conjugate of the combined frequency response of the SPD 108 and the sound sensing device 109, or an inverse/reciprocal function of the combined frequency response of the SPD 108 and the sound sensing device 109. In a perspective, the filter 206* may function as a matched filter, compensating an effect caused by the SPD 108 and the sound sensing device 109.

Given the subtracting circuit 203 within the circuit 200 may be realized by a differential amplifier, in an embodiment, the amplifier 203 may be an OP-amp. The negative input terminal of the amplifier 203 (annotated as "−") may be coupled to an output of the filter 206* (and thus the sound sensing device 109), while the positive input terminal of the amplifier 203 (annotated as "+") is configured to receive the input audio signal Ss. The difference signal Sdf is generated according to a difference between the signal Sfb and the input audio signal Ss. For example, the difference between the signal Sfb and the input audio signal Ss is amplified to generate the difference signal Sdf from the output terminal of the amplifier 203 coupled to an optional filter 204 of the circuit 200 (and thus the SPD 108).

In an embodiment, the optional filter 204 may be configured to maintain the overall stability of the feedback loop 215 to achieve a proper phase margin when the loop gain is larger than or equal to 1. Specifically, the input audio signal Ss may be split into two sub-bands by a crossover circuit of the circuit 200, via a (high-pass) filter 201 and the (low-pass) filter 204. The acoustic feedback loop mechanism (of the feedback loop 215) is applied to the output of the filter 204 but not to the output of the filter 201 to ensure stability. That is, the close-loop behavior of the feedback loop 215 may be band-limited with the filter 204 in order to ensure stability and maintain proper phase margin over the feedback loop 215. Besides, the input audio signal Ss may be band-split so as to cover the incompleteness/imperfectness of near-zero-phase-lag (NZPL) (or to eliminate/reduce phase-lag) because non-zero latency (or phase-lag) may occur in the SPD 108, in the sound sensing device 109, or the time of sound traveling from the SPD 108 to the sound sensing device 109 (as it may take time for the sound pressure to travel from the SPD 108 to the sound sensing device 109).

The missing part of the frequency response due to the filter 204 (placed in the feedback loop 215) may be supplanted/supplemented by the signal path formed by the filter 201 (outside of the feedback loop 215). Correspondingly, the cutoff frequency of the filter 204 and the cutoff frequency of the filter 201 may align at a crossover frequency. In an embodiment, the crossover frequency of the filter 204 and filter 201 may be significantly lower than the maximum human audible frequency (e.g., 20 kilohertz (KHz)) of the human hearing range (20 Hz to 20 KHz). Furthermore, after passing through the filter 204, the difference signal Sdf may be superimposed on the input audio signal Ss traveling through the filter 201 by a summation circuit 202 of the circuit 200 so as to generate a mix signal Smx (namely, Smx=Ss+Sdf) where Smx has a substantially flat frequency response. In an embodiment, the summation circuit 202 may be implemented as a resistive network mixer at the input of the amplifying circuit 107.

An amplifying circuit 107 of the circuit 200 amplifies the mix signal Smx received from the summation circuit 202 and produces the driving voltage Vspd. The difference signal Sdf may be part of the input (namely, part of the mix signal Smx) to the amplifying circuit 107.

Subsequently, the SPD 108 generates the sound SP108 according to the driving voltage Vspd.

As to be illustrated by the discussion in the subsequent paragraphs, by virtue of the sound sensor 109 and the difference/differential amplifier 203, the driving voltage Vspd driving the sound SP108 of this embodiment comprises, effectively, the signal components associated with the input audio signal Ss and the corrective signal components associated with the inverse of the aggregation of the noises SPn.

To start, considering an ideal case when there is no noise present between the SPD 108 and the sound sensing device 109, the output (namely, the signal Sfb) of the filter 206* may be close to a carbon copy of the input audio signal Ss (or a signal Sss, which would be elaborated later). The signal Sfb transmitted to the inverting input terminal of the amplifier 203 and the input audio signal Ss transmitted to the non-inverting input terminal of the amplifier 203 may be in-phase, and the difference signal Sdf output from the amplifier 203 may be a scaled down version of the input audio signal Ss.

Now consider a practical case where many of the noises SPn exists (i.e., have non-zero value) and is/are mixed with the sound SP108 into the combined sound pressure sensed/detected by the sound sensing device 109, the output of the filter 206* will deviate from the carbon copy of the input audio signal Ss (or the signal Sss) by an amount of "error", i.e. by an error corrective. The magnitude of this error corrective, corresponding to the difference between the signal Sfb and the scaled down copy/version of the input audio signal Ss, represents how much the signal Sfb deviates from the input audio signal Ss. By connecting such a deviation to the negative input of amplifier 203, a corrective (constituting the difference signal Sdf) is generated by 203 and becomes the input of the summation circuit 202. Therefore, the sound SP108 produced by the SPD 108 includes not only a sound/acoustic pressure corresponding to the input audio signal Ss (or the signal Sss) but also a corrective sound/acoustic pressure inversely corresponding to the noises SPn. This corrective sound pressure will interfere destructively with the noises SPn, causing the noises SPn, both nonstationary and stationary, to be suppressed. In this manner, NZPL ANC is achieved through the use of the system 20.

As can be seen above, a critical factor for achieving the noise canceling effect is the intermixing of the acoustic propagation path from the SPD 108 to the sound sensing device 109 with the acoustic propagation path between SPD 108 and the listener's ear drum. When the sound SP108 from the SPD 108 travels to the sound sensing device 109 over the air, audio mixing may occur. The sound SP108 generated by the SPD 108 is mixed with all kinds of other sound pressures (namely, the noises SPn) within the ear, and the combined sound pressure as a whole is converted back to the sensed signal Sm2 by sound sensing device 109 and then change to the signal Sfb after going through the feedback loop 215.

In an embodiment, the amplifying circuit 107, the SPD 108 (which may be a pieozoelectric actuated Micro Electro Mechanical System (MEMS) speaker), the sound sensing device 109 (which may be a piezoelectric microphone), the amplifier 205, the filter 206*, the amplifier 203, the filter 204, and the summation circuit 202 may constitute the feedback loop 215. The phase lag of the feedback loop 215 may be minimized. In an embodiment, the SPD 108 or the sound sensing device 109 may have the near zero phase lag/delay property similar to U.S. provisional application No. 62/909,684 and/or U.S. application No. 16/821,983. That is, at least one of the NZPL conditions stated in the above is satisfied.

Similar to U.S. provisional application No. 62/909,684 and/or U.S. application No. 16/821,983, the system 20 may further include a sound sensing device 101 to sense/detect an ambient sound/acoustic pressure (e.g., the noise(s) SPn), which may be produced from the ambient/background acoustic source(s) and produce a signal Sm1. The signal Sm1 is amplified (and polarity-inverted or non-inverted) by an amplifier 104 of the system 20, and subsequently frequency shaped and phase compensated by a filter 105 of the system 20. The gain of the amplifier 104 and the frequency response of the filter 105 are controlled by a controller 110 of the system 20. A signal Spt output from the filter 105 is combined with the signal Sss from, for instance, a (regular) sound source by a summation circuit 106 of the system 20 so as to generate the input audio signal Ss.

The sound sensing device 101 may not be responsible for ANC. Instead, the sound sensing device 101 may be used to pass or reject/attenuate certain part of the ambient sound pressure. In a sense, ANC is achieved completely by the feedback loop 215 where all sorts of mismatches, whether they are caused by the ambient/background acoustic source(s) or the mechanical source(s) or the acoustic resonance of ear canal, or simply the nonlinearity of the SPD 108, may be actively nulled-out by the feedback loop 215.

The system 20 may be applied in an application of an in-ear headset or on-ear headset. For an on-ear headset, the SPD 108, which is membrane-movement based, may not produce the necessary SPL and may be replaced by suitable alternatives such as those introduced in U.S. Pat. No. 10,779,088 using driving waveform introduced in U.S. Pat. No. 10,771,893, which are incorporated herein by reference.

Figure 3:
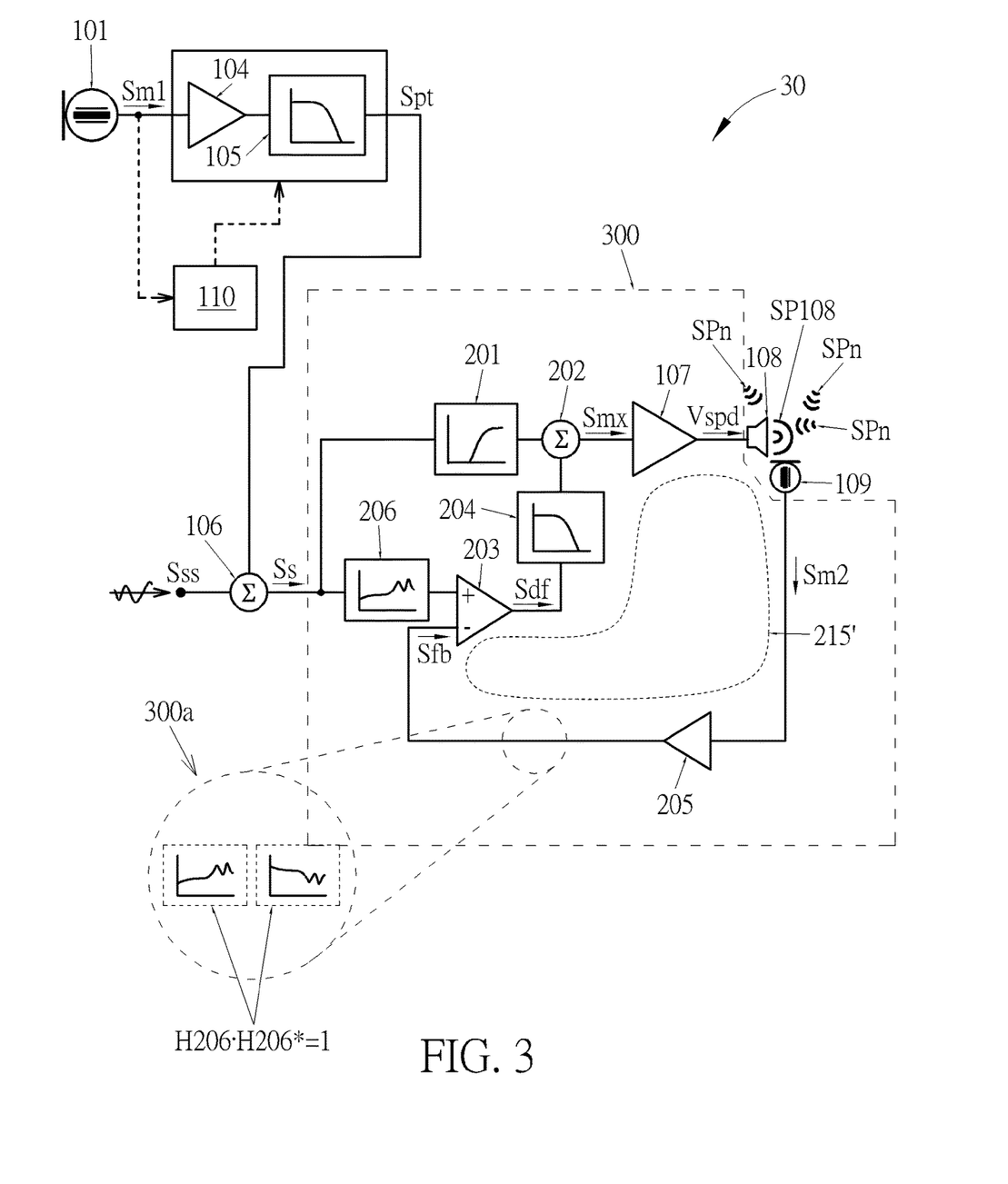

FIG. 3 is a schematic diagram of a system 30 according to an embodiment of the present application. The structure of the system 30 shown in FIG. 3 is similar to that of the system 20 shown in FIG. 2. However, the filter 206* shown in FIG. 2 is removed while a filter 206 is added in FIG. 3. The filter 206 may be placed right before the non-inverting input terminal of the difference/differential amplifier 203.

In an embodiment, the frequency response of the filter 206 may be equal to or related to the combined frequency response of the SPD 108 and the sound sensing device 109. In an embodiment, the frequency response of the filter 206 may be a function of the combined frequency response of the SPD 108 and the sound sensing device 109. In an embodiment, the product of the transfer function H206 of the filter 206 and the transfer function H206* of the filter 206* may equal a unity-gain transfer function (namely, H206*·H206=1); consequently, the circuit 300 may be derived from the circuit 200 by inserting the filter 206 to the non-inverting input terminal and the inverting input terminal of the amplifier 203 respectively and then removing the filter 206 and the filter 206* coupled to the inverting input terminal from the feedback loop 215' because of the unity-gain transfer function (namely, H206*·H206=1). Arrow 300a points to an enlarged view of an alternative to the indicated/circled area illustrating a segment of the feedback loop 215'. As can be seen above, the output of the amplifier 203 of the circuit 300 may equal the output of the amplifier 203 of the circuit 200; in other words, other than the imperfectness of the filters 206 and 206*, the feedback loops 215' and 215 are functionally and mathematically equivalent.

Structurally, the advantage of the circuit 300 over the circuit 200 is replacing the (in-loop) latency of the filter 206* within the feedback loop 215 by the (off-loop) latency of the filter 206 outside of the feedback loop 215'. The impact of the "in-loop to off-loop transformation" may minimize the in-loop latency of the feedback loop 215', and a digital version of the system 30 may achieve significantly wider frequency response than that of the system 20.

Figure 4:
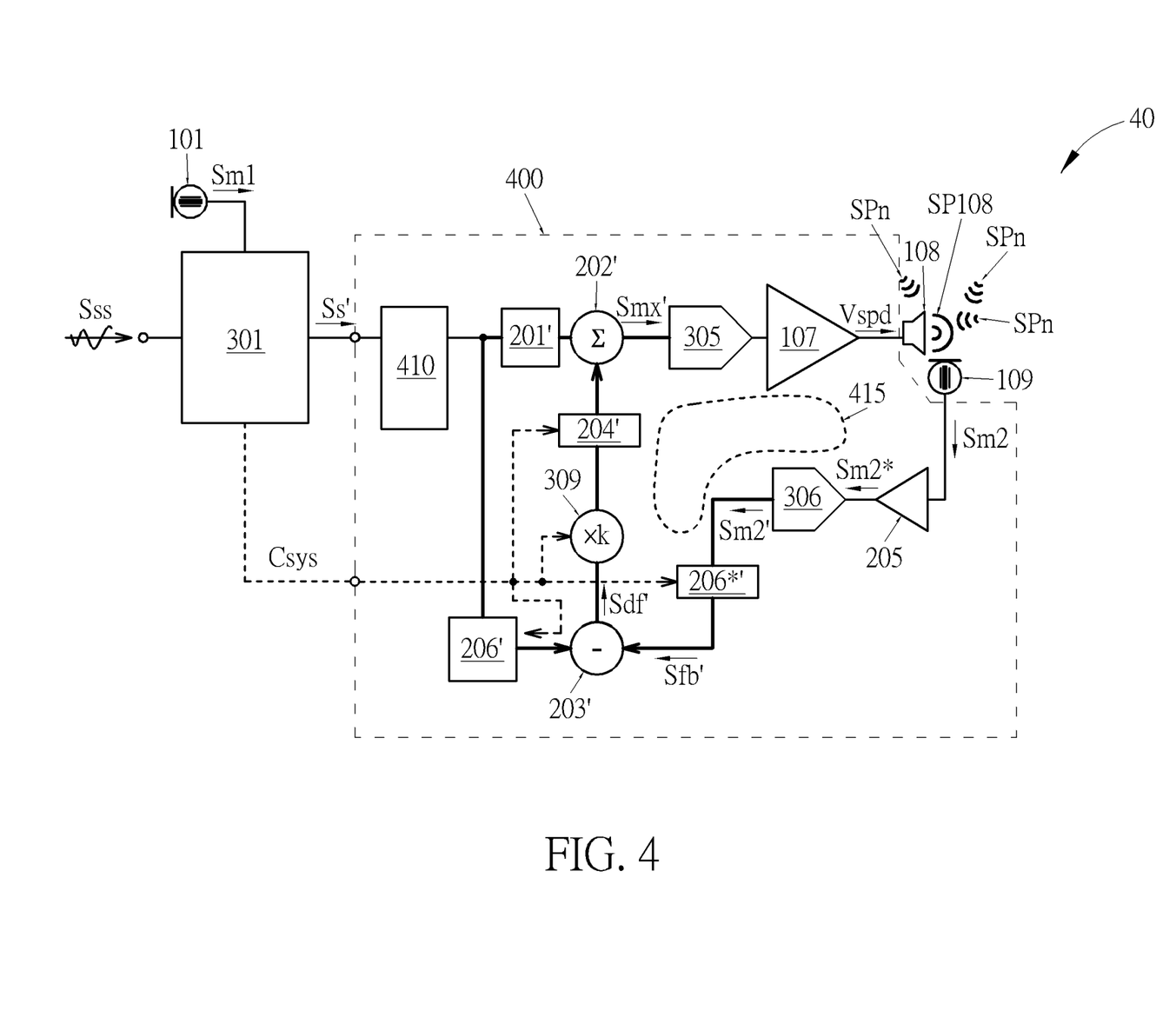

FIG. 4 is a schematic diagram of a system 40 according to an embodiment of the present application. The system 40 may include the SPD 108, the sound sensing device 109, and a circuit 400. The circuit 400 may be an application specific integrated circuit (ASIC).

The system 40 shown in FIG. 4 may be a digital version of the system 20 shown in FIG. 2. Therefore, the same numerals/notations denote the same components, while components performing the same function in digital format are labeled by appending a single quote (') to the numerals/notations of their analog counterparts. For example, filters 201', 204', 206*', and 206' of the circuit 400 may be digital counterparts of the filters 201, 204, 206*, and 206, respectively. In other words, the filters 201', 204', 206*', and 206' may be digital filters, while the filters 201, 204, 206*, and 206 may be analog filters.

In an embodiment, the filters 201', 204', 206*', and 206' may include one or more BiQuad accelerator(s)/filter(s), respectively. In an embodiment, a BiQuad accelerator may be the Direct form 2 of a BiQuad filter, which includes 5 multiplications, 4 additions and 2 registers per stage, where the register(s) serve/function as storage unit(s), and one register may represent one storage unit. In an embodiment, a BiQuad accelerator may be implemented by suitable alternatives such as those introduced in U.S. provisional application No. 63/079,680, which is incorporated herein by reference, with 6 adders and 2 registers per stage without any multiplication. That is, by properly choosing the filter coefficients of the filters (e.g., 201', 204', 206*', and 206'), as introduced in U.S. provisional application No. 63/079,680, the filters in FIG. 4 (e.g., 201', 204', 206*', and 206') may comprise no multiplication circuit.

In an embodiment, allocation of configurable BiQuad accelerators may be controlled by a configuration register. For example, there may be a total of 4 available BiQuad accelerators shared between the filters 206*' and 206'. In FIG. 4, one of the 4 BiQuad accelerators is allocated to the filter 206*', and three of the 4 BiQuad accelerators is allocated to the filter 206'. In another embodiment, all of the 4 BiQuad accelerators is allocated to the filter 206', while none of the 4 BiQuad accelerators is allocated to the filter 206*'.

As set forth above, the sound sensing device 109 produces the sensed signal Sm2 according to the combined sound pressure picked up inside the listener's ear canal. After receiving the sensed signal Sm2 from the sound sensing device 109, the amplifier 205 of the circuit 400 outputs a signal Sm2* to an analog-to-digital converter (ADC) 306, which converts the (analog) signal Sm2* into a (digital) signal Sm2'. The filter 206*' placed in a feedback loop 415 of the circuit 400 may send a signal Sfb' to a subtraction circuit 203' of the circuit 400. The subtraction circuit 203' is configured to subtract the signal Sfb' from an input audio signal Ss', which may be processed by an up-sampling circuit 410 of the circuit 400 and the filter 206', to obtain a difference signal Sdf'. A summation circuit 202' of the circuit 400 may then add the input audio signal Ss', which passes through the up-sampling circuit 410 and the filter 201', and the difference signal Sdf' traveling through a multiplier 309 of the circuit 400 and the filter 204' so as to transmit a mix signal Smx' to a digital-to-analog converter (DAC) 305 of the circuit 400. In an embodiment, the summation circuit 202' may be implemented as an adder. The amplifying circuit 107 of the circuit 400 may turn the output of the DAC 305 into the driving voltage Vspd, which drives the SPD 108 to produce the sound SP108.

A processing circuit 301 of the system 40 may combine the signal Sm1 from the sound sensing device 101 with the signal Sss so as to generate the input audio signal Ss'. Besides, the processing circuit 301 may program configuration parameters such as coefficients for the filters 201', 204', 206*', and 206', and/or the multiplier 309 via a control interface Csys, which may be an I²C (Inter-Integrated Circuit), SPI (Serial Peripheral Interface) or other suitable serial bus. In an embodiment, the coefficients for the filter 201', 204', 206*', or 206' may be related (e.g., proportional) to its sampling rate, center/cutoff frequency, Q-factor, and/or gain. In an embodiment, the filter 201', 204', 206*', or 206' may be omitted when its coefficient(s) is/are set to, for example, zero. In an embodiment, the coefficient for the multiplier 309 may be associated to the gain of the subtraction circuit 203 shown in FIG. 2

Figure 5:
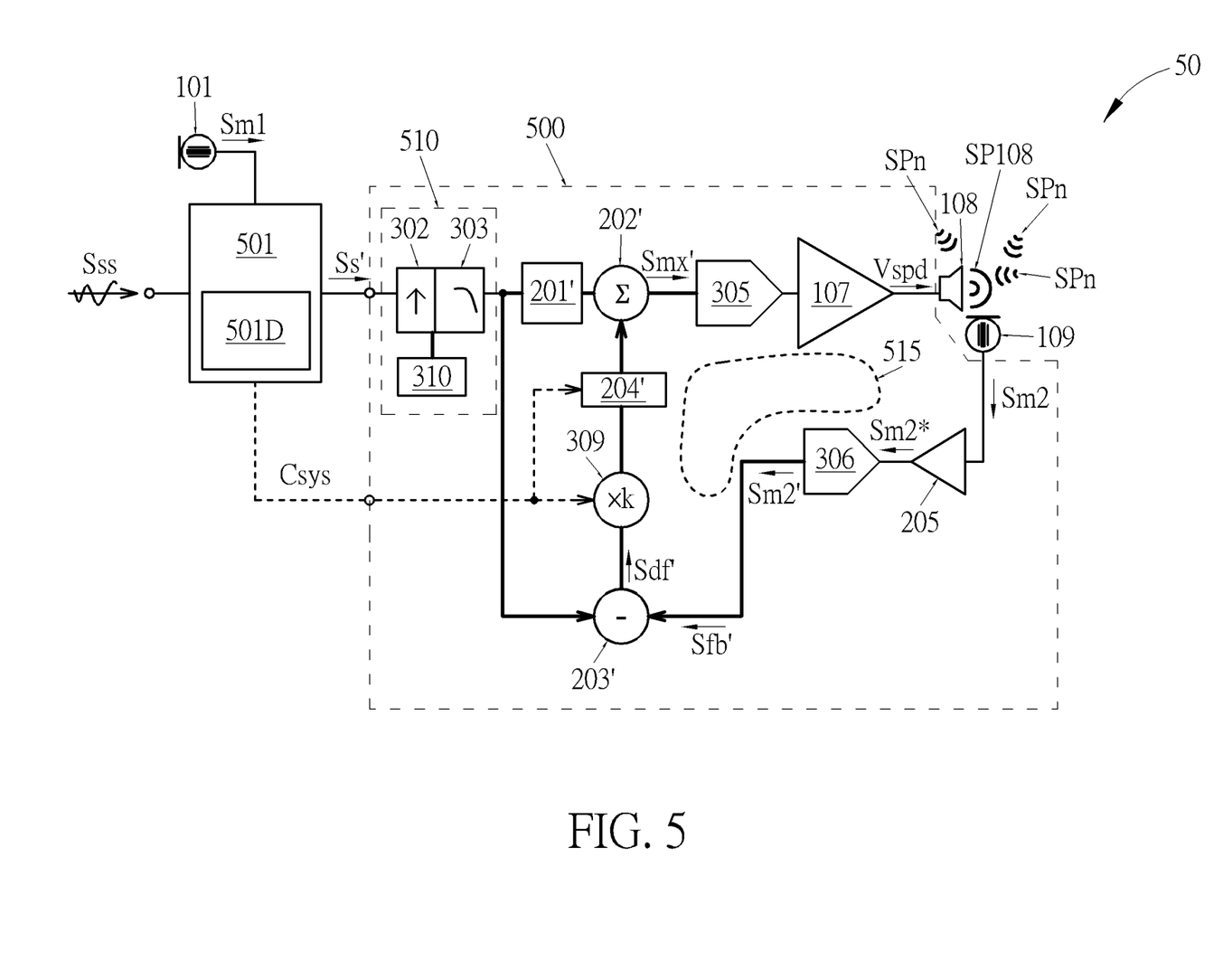

FIG. 5 is a schematic diagram of a system 50 according to an embodiment of the present application. The system 50 may include the SPD 108, the sound sensing device 109, and a circuit 500.

The structure of the system 50 shown in FIG. 5 is similar to that of the system 40 shown in FIG. 4, while the filters 206*' and 206' may be omitted from FIG. 5 to save power and/or cost. The system 50 may further include a processing circuit 501 configured to handle the computation of the filter 206' or 206*'. In an embodiment, the processing circuit 501 may be an application processor, and may include a digital signal processor (DSP) 501D.

An up-sampling circuit 510, configured to generate an oversampled version of the input audio signal Ss' at a higher data rate than that of the circuit 500 may include an up-sampler 302, a filter 303, and a phase-locked loop 310. The up-sampler 302 may involve a decimation operation and an interpolation operation. The filter 303, configured to filter out or attenuate higher frequency components induced by the up-sampler 302, may be a low-pass filter to smooth its output. In an embodiment, the data rate (e.g., 32×48 Ksps=1.536 Msps) in the circuit 500 may be up-sampled 32 times, by the up-sampler 302 and filter 303, as much as the data rate of the input audio signal Ss', which may be 48 Ksps (kilo samples per second).

In an embodiment, the circuit 500 may include BiQuad filters (e.g., the filter 201', 204', or 303) running at a vastly up-sampled local data rate to minimize the phase lag of a feedback loop 515 of the circuit 500 and achieve a NZPL ANC/ANS (active noise cancelling/adaptive noise suppression) for both non-stationary and stationary noises.

Figure 6:
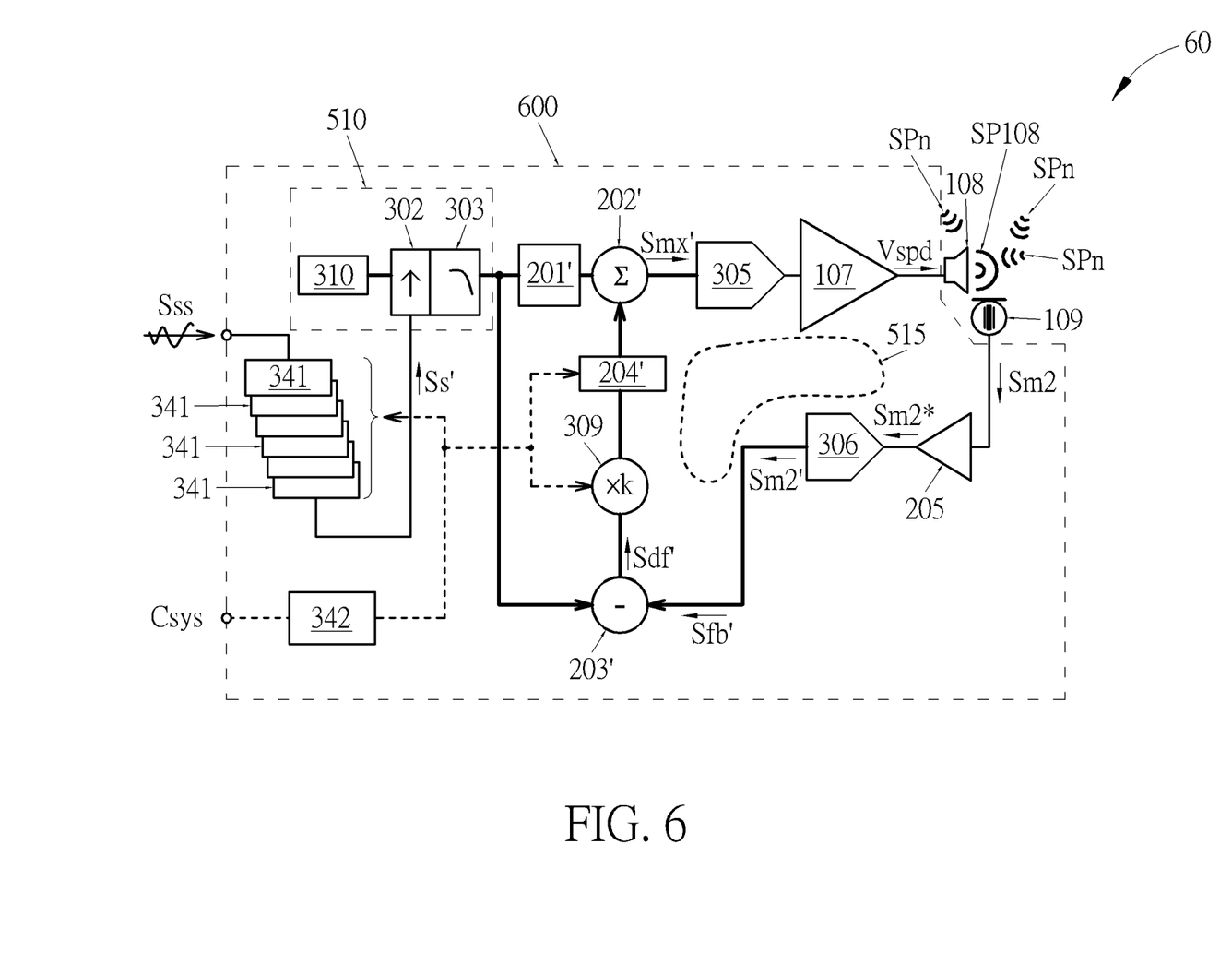

FIG. 6 is a schematic diagram of a system 60 according to an embodiment of the present application. The system 60 may include the SPD 108, the sound sensing device 109, and a circuit 600.

The structure of the system 60 shown in FIG. 6 is similar to that of the system 50 shown in FIG. 5, while the processing circuit 501 shown in FIG. 5 is replaced with filters 341 of the circuit 600 shown in FIG. 6. Each of the filters 341 may be a digital filter such as a BiQuad filter. For example, there may be a bank of six BiQuad stages/filters embedded in the circuit 600 to supplant the DSP function of the processing circuit 501.

A memory 342 of the circuit 600, configured for storing the configuration parameters such as the coefficients for the filters 341, 204', 303, 201', and/or the multiplier 309, may be an EEPROM (electrically-erasable programmable read-only memory). The control interface Csys may provide interface access for programming the memory 342. Once the memory 342 is set up, such as during mass-production calibration stage, the circuit 600 may function as a standalone device, interfacing to the signal Sss, sensing the output from the sound sensing device 109, and controlling the driving voltage Vspd for the SPD 108, without the need of an extra application processor.

Figure 7:
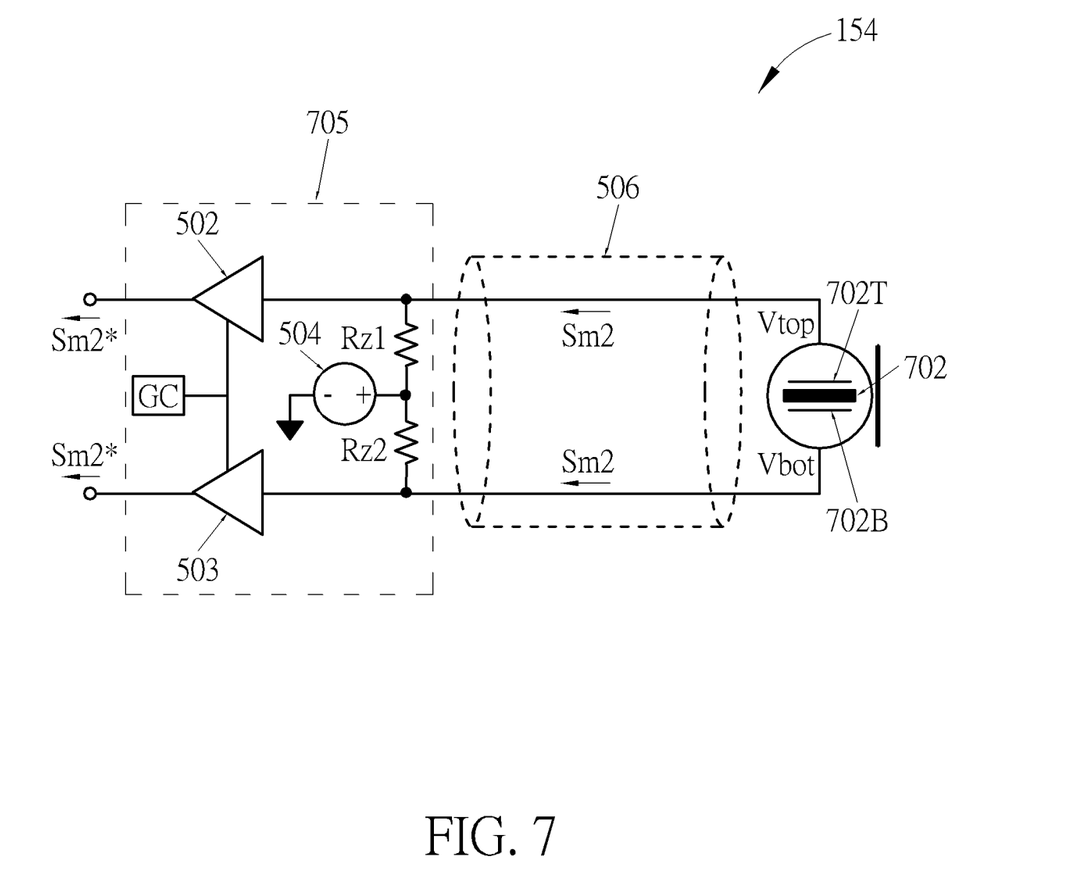
FIG. 7 is a schematic diagram of a low-noise preamplifier topology according to an embodiment of the present application.

FIG. 7 is a schematic diagram of a low-noise preamplifier topology 154 according to an embodiment of the present application.

In an embodiment, the sound sensing device 109 shown in FIG. 4 may be implemented as a piezoelectric microphone such as a sound sensing device 702 placed in the low-noise preamplifier topology 154 shown in FIG. 7. A bias voltage source $V_{BIAS}$ may be applied across the top and bottom electrodes 702T, 702B of the sound sensing device 702, respectively. The sensed signal Sm2 generated by the sound sensing device 702, corresponding to the difference between electrode 702T and 702B (or voltage Vtop and Vbot), may be unbalanced and/or of high impedance in nature and may be sensitive to noises.

In an embodiment, a fine line tube 506 may represent carefully planned wiring traces on a silicon substrate and on a printed circuit board (PCB) (e.g., a PCB 424 shown in FIG. 9) so as to avoid the sensed signal Sm2 from picking up extraneous noises.

In an embodiment, the amplifier 205 shown in FIG. 4 may be implemented as an amplifier 705 placed in the low-noise preamplifier topology 154 shown in FIG. 7. The amplifier 705 may be configured to convert the sensed signal Sm2, which may be a high-impedance unbalanced signal produced by the sound sensing device 702, to the signal Sm2*, which may be a low-impedance balanced signal. The amplifier 705 may include a pair of resistors Rz1, Rz2, a voltage source 504, a pair of amplifiers 502, 503, and a host interface GC.

In order to maximize the signal-to-noise ratio (SNR), which is a critical parameter for a microphone, the capacitive nature of the sound sensing device 702 is utilized to turn the (unbalanced) signal Sm2 into a balanced signal by the resistors Rz1, Rz2, and the voltage source 504 providing a suitable bias voltage. In an embodiment, the value of the resistors Rz1, Rz2 may satisfy rz1=rz2 (requirement 1) to achieve desired signal symmetry, where rz1, rz2 represent the resistances of the resistors Rz1, Rz2, respectively. In an embodiment, the value of the resistors Rz1, Rz2 may satisfy $1/(2\pi \times (rz1+rz2) \times Cspd) < 5$ Hz (requirement 2) to achieve desired low-frequency response, where Cspd represents the capacitance of the sound sensing device 702. For example, when the sound sensing device 702 is a thin film PZT sensor and the size of the sound sensing device 702 is substantially 1.44 square millimeters (e.g., $1.2 \times 1.2$ mm$^2$), the capacitance Cspd of the sound sensing device 702 may be 30 nano-farad (nF). When the resistances rz1, rz2 of the resistors Rz1, Rz2 are 560 kilo-ohm (KΩ) respectively, the requirements 1 and 2 may be satisfied. The voltage provided by the voltage source 504 may equal $V_{BIAS}/2$ (where $V_{BIAS}$ may be configured to optimize the sensitivity and linearity of the sound sensing device 702) and may be in the range of 3~15 volts.

The sensed signal Sm2 is then buffered/amplified by the amplifiers 502, 503, each of which may be an OP-amp and have high input impedance (e.g., >10 mega-ohm), low input bias current (e.g., <3 pico-ampere (pA)) and low noise voltage (≤1 nano-volt per root hertz (nV/√ Hz)). In an embodiment, the amplifiers 502, 503 may be voltage buffers respectively. In an embodiment, the amplifiers 502, 503 may have the same gain.

The amplifiers 502, 503 may output the signal Sm2*, which may be transmitted to the differential input stage of the ADC 306 shown in FIG. 4. In an embodiment, the gain of the amplifiers 502, 503 may be real-time programmable via the host interface GC such that the dynamic range of the signal Sm2* may match the dynamic range of the input range of ADC 306.

Figure 8:
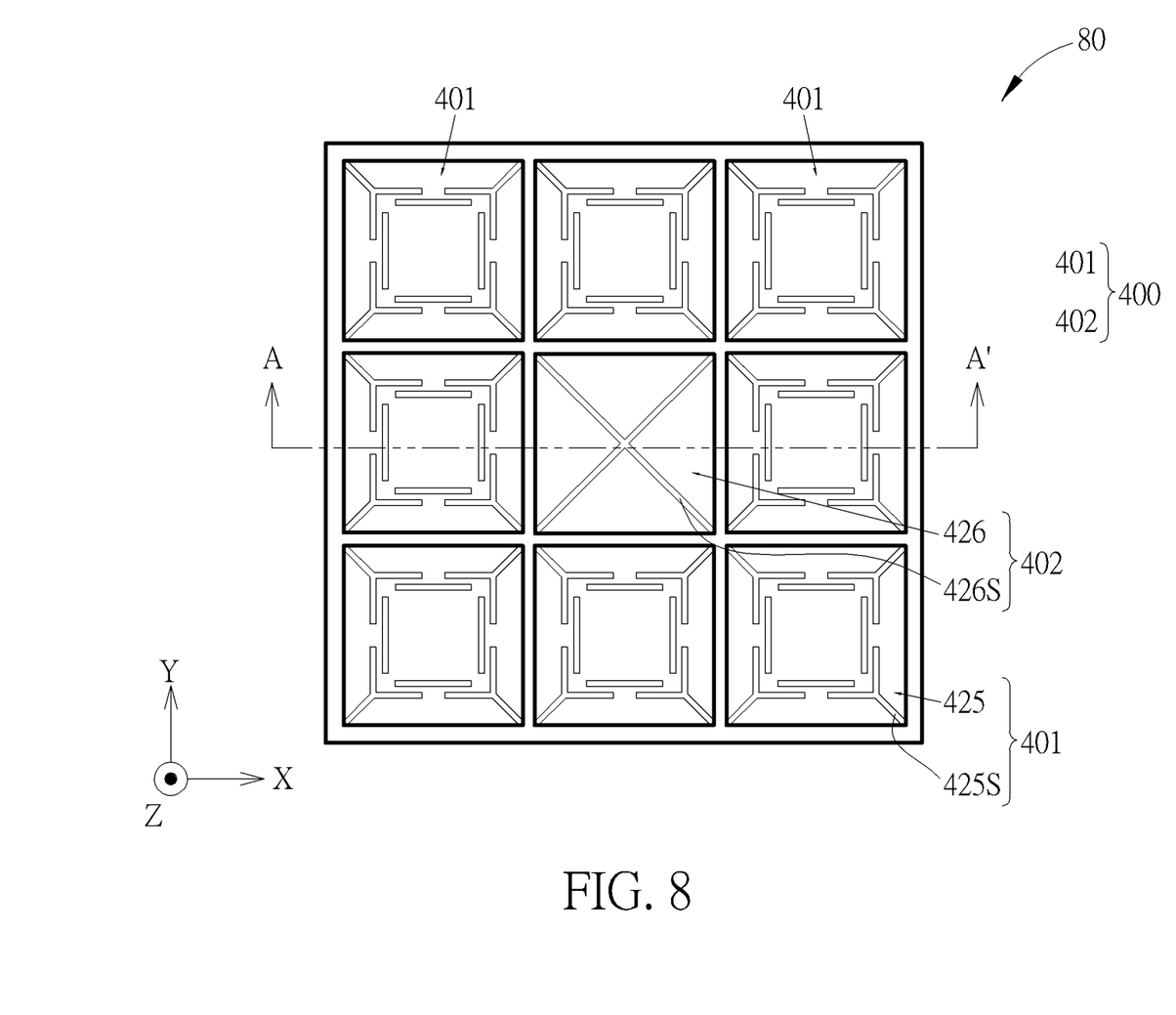
FIG. 8 is a schematic diagram illustrating a top view of a system according to an embodiment of the present application.
Figure 9:
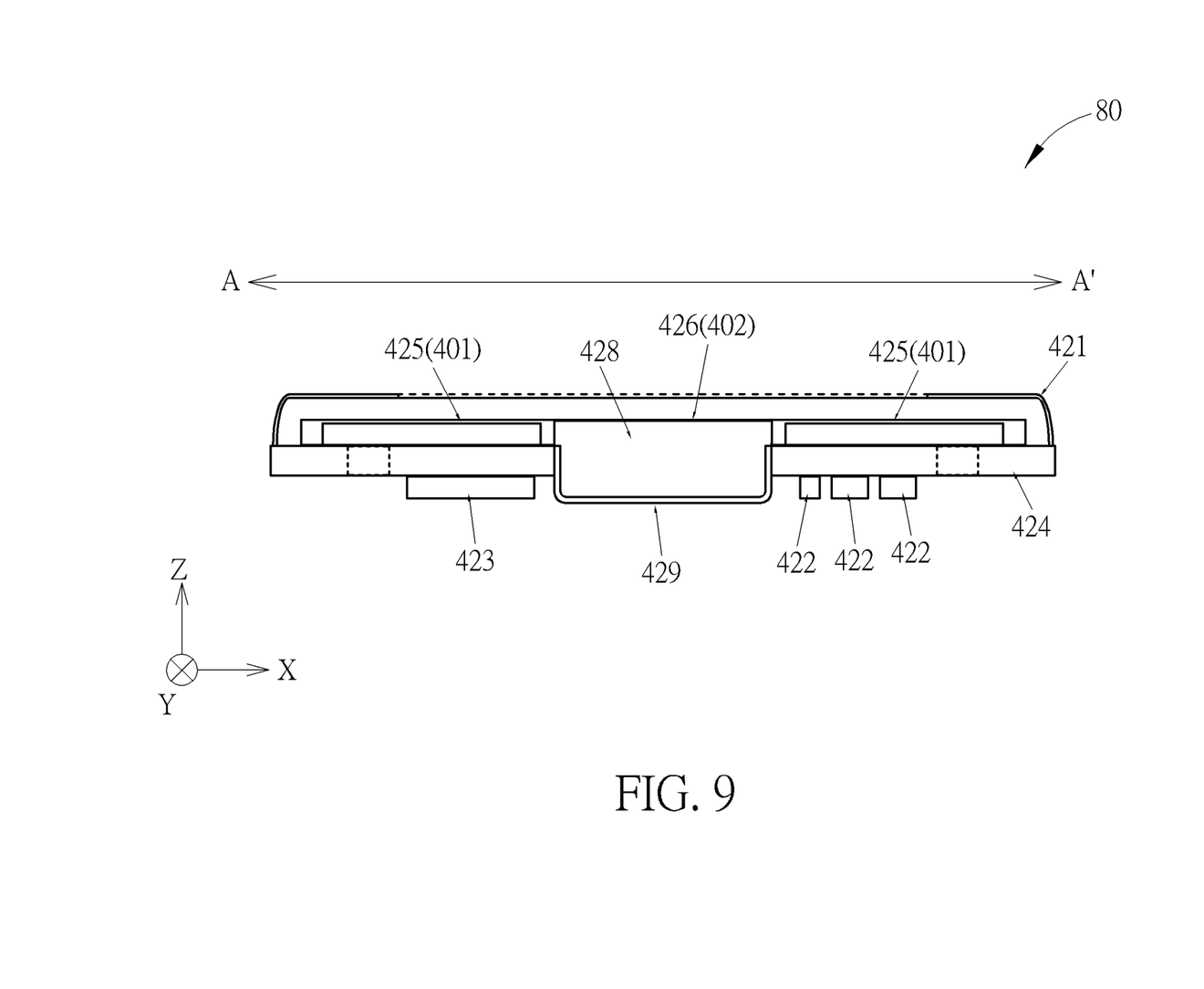
FIG. 9 is a cross-sectional view taken along a cross-sectional line A-A' in FIG. 8.

FIG. 8 is a schematic diagram illustrating a top view of a system 80 according to an embodiment of the present application. FIG. 9 is a cross-sectional view taken along a cross-sectional line A-A' in FIG. 8. A device 400 of the system 80 may include eight sound producing devices (SPDs) 401 and one sound sensing device 402 arranged in an array. The size of each SPD 401 or the sound sensing device 402 may be the same, e.g., 2 mm×2 mm, but not limited there to.

In an embodiment, the SPD 108 may be implemented as one or more of the SPDs 401, and the sound sensing device 109 or 702 may be implemented as the sound sensing device 402 shown in FIG. 8. In an embodiment, a spacing between the SPD 401 and the sound sensing device 402 may be less than 3.5 mm. In an embodiment, the SPDs 401 shown in FIG. 9 may generate the sound SP108 upwards (in a positive Z direction), while the sound sensing device 402 shown in FIG. 9 may receive the combined sound pressure from top (in a negative Z direction).

In an embodiment, the device 400 may be integrally formed, such that the SPDs 401 and the sound sensing device 402 are formed with the same material and their connection has no mechanical joints. In an embodiment, the device 400 may be one single MEMS chip. The device 400 may be fabricated out of a monolithic silicon substrate by a MEMS fabrication process to create a membrane 425 for each of the SPDs 401 and a membrane 426 for the sound sensing device 402.

In an embodiment, the thickness of the membrane 426 may be significantly thinner than that of the membrane 425 to enhance sound sensing sensitivity of the sound sensing device 402. In an embodiment, the membranes 425, 426 are coplanar or parallel, and thus span the XY plane respectively.

In FIG. 8, the SPD 401 and the sound sensing device 402 may have slit patterns 425S, 426S formed within the membranes 425, 426, respectively, to increase the compliance (e.g., stiffness) of the membranes 425, 426 and the displacements of the membranes 425, 426. The slit patents 425S, 426S may be different from each other and optimized for the respective functions of the cell types of the SPD(s) 401 and the sound sensing device 402.

The SPDs 401 or the sound sensing device 402 may further include a thin film piezoelectric layer made of thin-film piezoelectric material(s) such as PZT (lead zirconate titanate) for actuating a membrane (as in the case of the SPD 401) or aluminum nitride (AlN) for sensing sound pressure (the membrane 426 as in the case of the sound sensing device 402). The thin film piezoelectric layer may be sandwiched between two electrodes (e.g., the electrodes 702T, 702B of the sound sensing device 702 shown in FIG. 7), and may be deposited on the membrane 425 or 426 to form the SPD 401 or the sound sensing device 402.

In an embodiment, the sound sensing device 402 may further include an isolating back chamber, which includes a cavity 428 and a back cover 429, to insulate the sound sensing device 402 from the backpressure produced by the membrane movement of cells 401.

The device 400 may be bounded to the PCB 424, together with a protective cap 421 and circuit 423 to form a self-contained Speaker-in-a-Package system. The circuit 423, which may be a driving IC, may be implemented as the circuit 200, 300, 400, 500, or 600 and may have other architecture possessing comparable functionalities. Together with supporting passive components 422, the circuit 423 forms a self-contained feedback control system with the device 400, capable of sensing the combined sound pressure within the listener's ear and producing a corrective sound/acoustic pressure to suppress the difference between the sensed sound/acoustic pressure and the intended/desired sound/acoustic pressure and create a noise-free listening experience as a result. In other words, the device 400 is within one overall package with the feedback control to form a self-contained ANC/ANS sound production system.

In one aspect of the present invention, not only the noise(s) SPn (namely, sound/acoustic pressure) from the ambient/background acoustic source(s) but also the noise(s) SPn induced by the occlusion effects and/or microphonic effects, for example, due to the movement of the system of the present invention and/or any physical vibration coupled/related to the volume of the ear canal through human anatomy are suppressed/attenuate/cancelled to achieve ANC. In the present invention, not only the noise(s) SPn being stationary but also the noise(s) SPn being intermittent are suppressed/attenuate/cancelled to achieve ANC. Therefore, the present invention, which may be made possible by employing NZPL techniques disclosed in U.S. provisional application No. 62/909,684, senses the combined sound pressure within the ear and control the SPD such that the mismatch between the intended/desired sound signal and the detected/sensed sound pressure within the ear is minimized.

In one aspect of the present invention, by utilizing the SPD and the sound sensing device of NZPL, an in-ear, or on-ear sound producing system, which may be similar to negative-feedback OP-amp, is constructed where the mismatches of all sources, whether they are noises SPn, e.g., acoustic noise(s), microphonic noise(s); deviation(s) due to factors such as nonlinearity or frequency response unevenness of the SPD; the acoustic interaction between SPD and the ear canal, or simply the leakage due to the changing degree of sealing of the ear piece's foam tips, will all be suppressed instantaneously, or in real-time, such that the net sound pressure within the ear of the listener may match the intended sound pressure, much in the same way as the output of a negative-feedback OP-amp matches its input signal closely. Therefore, corrective acoustic pressure generation based on the real-time signal, as opposed to signal that has been delayed by 180° or more, is achieved in the present invention to correct both the additive and the subtractive of deviations from the intended sound pressure.

To sum up, the system of the present invention includes a sound sensing device configured to detect a sound (pressure) produced not only by a SPD but also from ambient/background acoustic source(s), from mechanical source(s) or via leakage (if there is any). A subtraction circuit of the system has an input terminal coupled to the sound sensing device and an output terminal is coupled to the SPD, thereby forming a feedback loop. When the ambient/background acoustic source(s) or the mechanical source(s) and/or leak(s) exists/exist, "error" observed at the output terminal of the subtraction circuit leads to a corrective being present at the input of the SPD. Therefore, the sound (pressure) produced by the SPD includes a sound/acoustic pressure corresponding to an input audio signal and a corrective sound/acoustic pressure. The corrective sound pressure may interfere destructively with the sound (pressure) from the ambient/background acoustic source(s) or from the mechanical source(s), thereby achieving NZPL ANC.

Those skilled in the art will readily observe that numerous modifications and alterations of the device and method may be made while retaining the teachings of the invention. Accordingly, the above disclosure should be construed as limited only by the metes and bounds of the appended claims.

In the present application, the term "coupled to" may refer to direct or indirect connection. "Component A being coupled to component B" may indicate that component A is directly connected to component B or component A is connected to component B via some component C.

What is claimed is:

1. A system, disposed within a wearable hearing device, comprising: a sound producing device, abbreviated to SPD, driven by a driving voltage;
a first sound sensing device, configured to sense a combined sound pressure produced at least by the SPD and generate a sensed signal accordingly; and
a subtraction circuit, having a first input terminal, a second input terminal, and a first output terminal, wherein the first input terminal is coupled to the first sound sensing device, the first output terminal is coupled to the SPD;
wherein the SPD, the first sound sensing device, and the subtraction circuit constitute a feedback loop;
wherein a first phase delay between the driving voltage and the sensed signal is less than 60°, wherein a third phase delay from the driving voltage being applied to the SPD to a produced sound being produced by the SPD corresponding to the driving voltage is less than 30°.

2. The system of claim 1, further comprising:
a first filter, coupled between the first input terminal of the subtraction circuit and the first sound sensing device.

3. The system of claim 2, wherein a frequency response of the first filter is related to a reciprocal of a combined frequency response of the SPD and the first sound sensing device.

4. The system of claim 1, further comprising:
a second filter, coupled to the second input terminal of the subtraction circuit;
wherein a frequency response of the second filter is related to a combined frequency response of the SPD and the first sound sensing device.

5. The system of claim 1, further comprising:
a third filter, coupled between the first output terminal of the subtraction circuit and the SPD;
wherein the third filter is a low-pass filter.

6. The system of claim 5, further comprising:
a summation circuit, wherein a third input terminal of the summation circuit is coupled to the third filter, a second output terminal of the summation circuit is coupled to the SPD; and
a fourth filter, coupled between the second input terminal of the subtraction circuit and a fourth input terminal of the summation circuit;
wherein the fourth filter is a high-pass filter.

7. The system of claim 1, wherein the wearable hearing device is an earpiece with an insertion type.

8. The system of claim 1, wherein the combined sound pressure comprises acoustic sound pressure which presents within an ear canal.

9. The system of claim 1, wherein the combined sound pressure comprises an air leakage due to the wearable hearing device.

10. The system of claim 1, further comprising:
an up-sampling circuit, coupled to the second input terminal of the subtraction circuit.

11. The system of claim 1, further comprising:
a processing circuit, configured to program coefficients for a first filter coupled between the first input terminal of the subtraction circuit and the first sound sensing device, a second filter coupled to the second input terminal of the subtraction circuit, a third filter coupled between the first output terminal of the subtraction circuit and the SPD, a fourth filter coupled between the second input terminal of the subtraction circuit and the fourth input terminal of a summation circuit, a fifth filter of an up-sampling circuit, or a multiplier coupled between the first output terminal of the subtraction circuit and the SPD.

12. The system of claim 1, further comprising:
at least one sixth filter, configured to program coefficients for a first filter coupled between the first input terminal of the subtraction circuit and the first sound sensing device, a second filter coupled to the second input terminal of the subtraction circuit, a third filter coupled between the first output terminal of the subtraction circuit and the SPD, a fourth filter coupled between the second input terminal of the subtraction circuit and the fourth input terminal of a summation circuit, a fifth filter of an up-sampling circuit, or a multiplier coupled between the first output terminal of the subtraction circuit and the SPD; and
a memory, configured for storing the coefficients.

13. The system of claim 1, wherein the subtraction circuit is a differential amplifier.

14. The system of claim 1, further comprising:
a voltage source, configured to provide a bias voltage;
a first resistor, wherein a first terminal of the first resistor is coupled to a first electrode of the first sound sensing device, a second terminal of the first resistor is coupled to the voltage source;
a second resistor, wherein a third terminal of the second resistor is coupled to a second electrode of the first sound sensing device, a fourth terminal of the second resistor is coupled to the voltage source;
a first amplifier, coupled to the second terminal; and
a second amplifier, coupled to the fourth terminal.

15. The system of claim 1, further comprising:
a second sound sensing device, coupled to the second input terminal of the subtraction circuit, wherein the second sound sensing device is configured to detect a sound pressure produced by an ambient acoustic source, the combined sound pressure is produced at least by the SPD and the ambient acoustic source.

16. The system of claim 1, comprising at least one filter coupled to the subtracting circuit, wherein the at least one filter comprises adders and storage units to perform filter coefficient multiplication, and the at least one filter comprises no multiplication circuit.

17. The system of claim 1, wherein a second phase delay from the combined sound pressure impinging upon the first sound sensing device to the sense signal being generated by the first sound sensing device corresponding to the combined sound pressure is less than 30°.

18. The system of claim 1, wherein a spacing between the SPD and the first sound sensing device is less than 3.5 millimeters.

19. The system of claim 1, wherein an acoustic propagation delay from the SPD to the first sound sensing device is less than 10 microseconds.

20. A method, comprising: sensing, by a first sound sensing device, a combined sound pressure produced at least by a sound producing device, abbreviated to SPD and producing, by the first sound sensing device, a sensed signal according to the combined sound pressure;
deducting a first signal corresponding to the combined sound pressure from an input audio signal to obtain a difference signal, wherein the first signal is generated according to the sensed signal;
obtaining a driving voltage according to the difference signal; and producing, by the SPD, a produced sound according to the driving voltage;
wherein a first phase delay between the driving voltage and the sensed signal is less than 60°, wherein a third phase delay from the driving voltage being applied to the SPD to a produced sound being produced by the SPD corresponding to the driving voltage is less than 30°.

21. The method of claim 20, wherein the first signal is generated by a first filter according to the sensed signal, wherein a frequency response of the first filter is related to a reciprocal of a combined frequency response of the SPD and the first sound sensing device.

22. The method of claim 20, wherein the input audio signal is produced by a second filter, wherein a frequency response of the second filter is related to a combined frequency response of the SPD and the first sound sensing device.

23. The method of claim 20, further comprising:
directing the difference signal through a third filter to obtain a first output signal;
wherein the third filter is a low pass filter.

24. The method of claim 23, further comprising:
directing the input audio signal through a fourth filter to obtain a second output signal; and
adding the first output signal and the second output signal, to obtain a mix signal.

25. The method of claim 20, wherein the input audio signal is resampled at an up-sampled data rate.

26. The method of claim 20, further comprising:
programming coefficients for a first filter coupled to the first sound sensing device, a second filter, a third filter coupled to the SPD, a fourth filter coupled to the SPD.

27. A system, disposed within a wearable hearing device, comprising:
a sound producing device, abbreviated to SPD, driven by a driving voltage;
a first sound sensing device, configured to sense a combined sound pressure produced at least by the SPI) and generate a sensed signal accordingly; and
a subtraction circuit, having a first input terminal, a second input terminal, and a first output terminal, wherein the first input terminal is coupled to the first sound sensing device, the first output terminal is coupled to the SN); wherein the SPD, the first sound sensing device, and the subtraction circuit constitute a feedback loop;
wherein a first phase delay between the driving voltage and the sensed signal is less than 60°, wherein a second phase delay from the combined sound pressure impinging upon the first sound sensing device to the sensed signal being generated by the first sound sensing device corresponding to the combined sound pressure is less than 30°.

28. A method, comprising: sensing, by a first sound sensing device, a combined sound pressure produced at least by a sound producing device, abbreviated to SN) and producing, by the first sound sensing device,
a sensed signal according to the combined sound pressure;
deducting a first signal corresponding to the combined sound pressure from an input audio signal to obtain a difference signal, wherein the first signal is generated according to the sensed signal; obtaining a driving voltage according to the difference signal; and producing, by the SN), a produced sound according to the driving voltage; wherein a first phase delay between the driving voltage and the sensed signal is less than 60°, wherein a second phase delay from the combined sound pressure impinging upon the first sound sensing device to the sensed signal being generated by the first sound sensing device corresponding to the combined sound pressure is less than 30°.

\* \* \* \* \*

UNITED STATES PATENT AND TRADEMARK OFFICE
CERTIFICATE OF CORRECTION

PATENT NO. : 11,223,891 B2
APPLICATION NO. : 17/149666
DATED : January 11, 2022
INVENTOR(S) : Jemm Yue Liang et al.

Page 1 of 1

It is certified that error appears in the above-identified patent and that said Letters Patent is hereby corrected as shown below:

On the Title Page

Item (54) and in the Specification, Column 1, Line 1, correct the title of the invention from "SYSTEM AND METHOD THEREOF" to --SYSTEM AND METHOD OF NOISE CANCELLATION IN A HEARING DEVICE--.

Signed and Sealed this
Nineteenth Day of April, 2022

Katherine Kelly Vidal
*Director of the United States Patent and Trademark Office*